United States Patent
Iinuma

(10) Patent No.: US 7,323,394 B2
(45) Date of Patent: Jan. 29, 2008

(54) METHOD OF PRODUCING ELEMENT SEPARATION STRUCTURE

(75) Inventor: Taikan Iinuma, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 300 days.

(21) Appl. No.: 11/226,412

(22) Filed: Sep. 15, 2005

(65) Prior Publication Data

US 2006/0073671 A1    Apr. 6, 2006

(30) Foreign Application Priority Data

Oct. 6, 2004    (JP)    ............... 2004-293587

(51) Int. Cl.
    *H01L 21/76*    (2006.01)
(52) U.S. Cl. ............ 438/414; 438/296; 438/404; 438/424; 438/425; 438/427; 438/428; 257/395; 257/396; 257/397
(58) Field of Classification Search ........... 438/428, 438/427, 425, 424, 414, 404, 296; 257/395, 257/396, 397
    See application file for complete search history.

(56) References Cited

U.S. PATENT DOCUMENTS

| 6,372,602 | B1 | 4/2002 | Mitsuiki | |
| 6,413,828 | B1 | 7/2002 | Lam | |
| 6,417,073 | B2 * | 7/2002 | Watanabe | 438/424 |
| 6,642,124 | B1 | 11/2003 | Yamauchi | |
| 2002/0056881 | A1 * | 5/2002 | Ogawa | 257/374 |

FOREIGN PATENT DOCUMENTS

| JP | 2000-323563 | 11/2000 |
| JP | 2001-135720 | 5/2001 |
| JP | 2001-267411 | 9/2001 |
| JP | 2001-267413 | 9/2001 |

* cited by examiner

*Primary Examiner*—Kiesha L. Rose
*Assistant Examiner*—Eric W Jones
(74) *Attorney, Agent, or Firm*—Takeuchi & kubotera, LLP

(57) ABSTRACT

A method of producing an element separation structure includes the steps of: forming a first thermal oxide film on the substrate; forming a silicon nitride film on the first thermal oxide film; removing the first thermal oxide film and the silicon nitride film in an element separation structure forming region; forming a groove portion in the element separation structure forming region; forming a groove portion oxide film in the groove portion; forming a pre-filling oxide film for filling the groove portion; removing the pre-filling oxide film; forming a resist layer on the silicon nitride film and the pre-filling oxide film; forming a resist mask on the element separation structure forming region; removing the silicon nitride film and the first thermal oxide film; forming a second thermal oxide film on the substrate; and removing the second thermal oxide film and leveling the pre-filling oxide film to form a filling portion.

4 Claims, 6 Drawing Sheets

METHOD OF PRODUCING ELEMENT SEPARATION STRUCTURE

BACKGROUND OF THE INVENTION AND RELATED ART STATEMENT

The present invention relates to a method of producing an element separation structure for separating a plurality of elements formed in a semiconductor substrate. In particular, the present invention relates to a method of producing an element separation structure called shallow trench isolation (STI).

Recently, a method of producing a semiconductor with a fine pattern has been sophisticated. Accordingly, with a conventional element separation method according to the LOCOS method, it is difficult to accurately form an element forming region (active region) for forming an element with a fine pattern. To this end, in the STI, a shallow groove is formed in a semiconductor substrate, and a silicon oxide film is filled in the groove for separating an element.

In the production method using the STI, the film structure is removed with a wet etching process in general. During the wet etching process, an undesirable dimple called a divot may be generated in the vicinity of a boundary between the STI and an active region. When the divot is created in the STI, it is possible that a material of, for example, a poly-silicon film to be formed in a step of forming a gate electrode may remain in the divot. As a result, an element formed in the active region may have deteriorated electrical property.

Several methods of forming the STI have been proposed for solving the problems associated with the divot in the STI. For example, after a groove portion is formed in a semiconductor substrate, an oxidation protection film such as a silicon nitride film is selectively and isotropically etched, so that an element separation film having an overhang is formed (see Patent Reference 1).

In Patent Reference 2, a nitride oxide film is formed on a sidewall of a trench, so that a stress applied to an oxide film filled in the trench is reduced, thereby preventing the divot from being generated.

In Patent Reference 3, an oxide layer, a poly-silicon layer, and a nitride layer are formed on a surface of a substrate. A trench is formed in the substrate, and a conformal oxide layer is thermally grown on sidewalls of the trench, the oxide layer, and the poly-silicon layer. Then, a trench dielectric material is filled in the trench, and the surface of the substrate is flattened, thereby forming the STI.

In Patent Reference 4, a thermal oxide film is formed on a surface of a silicon substrate. A mask pattern of a silicon nitride is formed on the thermal oxide film. A trench is formed using the mask pattern as a mask. A first silicon oxide film is filled in the trench, and the first silicon oxide film is removed until a surface of the silicon nitride film is exposed. Further, a second silicon oxide film is formed to fix a micro-scratch, thereby forming the STI.

Patent Reference 1: Japanese Patent Publication No. 2000-323563
Patent Reference 2: Japanese Patent Publication No. 2001-135720
Patent Reference 3: Japanese Patent Publication No. 2001-267413
Patent Reference 4: Japanese Patent Publication No. 2001-267411

In the method of producing the STI disclosed in Patent Reference 1, the nitride film is removed over a large area, thereby making it difficult to reduce a size of the active region. In the configuration disclosed in Patent Reference 2, when the oxide film on the sidewall of the trench contains nitrogen, a facet may be generated, thereby inducing connection leak. In the methods of producing the element separation structure disclosed in Patent Reference 3 and Patent Reference 4, it is difficult to obtain uniformity within a plane.

In view of the problems described above, an object of the present invention is to provide a technology capable of producing an element separation structure applicable to the advancement of recent fine patterning technology. In the present invention, it is possible to prevent the divot from being generated and obtain good uniformity within a plane without deteriorating an electrical property of an element formed in an active region.

Further objects and advantages of the invention will be apparent from the following description of the invention.

SUMMARY OF THE INVENTION

In order to attain the objects described above, according to the present invention, a method of producing an element separation structure includes the steps of: defining a plurality of element forming regions and an element separation structure forming region for separating the element forming regions on a substrate having a surface and a lower surface opposite to the surface; forming a first thermal oxide film on the surface of the substrate; forming a silicon nitride film on the first thermal oxide film; removing the first thermal oxide film and the silicon nitride film in the element separation structure forming region; forming a groove portion extending from the surface of the substrate into the substrate in the element separation structure forming region; forming a groove portion oxide film covering inside the groove portion; forming a pre-filling oxide film for filling the groove portion covered with the groove portion oxide film and covering exposed surfaces of the silicon nitride film and the first thermal oxide film; removing the pre-filling oxide film until the silicon nitride film is exposed and the pre-filling oxide film has a height same as that of the silicon nitride film in the element separation structure forming region; removing the pre-filling oxide film until the pre-filling oxide film with the height same as that of the silicon nitride film has a height same as that of the first thermal oxide film; forming a resist layer covering exposed surfaces of the silicon nitride film and the pre-filling oxide film; patterning the resist layer to form a resist mask having an opening at the element forming regions and covering the element separation structure forming region; sequentially removing the silicon nitride film and the first thermal oxide film exposed from the resist mask; forming a second thermal oxide film on an exposed surface of the substrate with the first thermal oxide film removed; and removing the second thermal oxide film and leveling the pre-filling oxide film at a height same as that of an exposed surface of the substrate after the second thermal oxide film is removed to form a filling portion.

In the method of producing the element separation structure, i.e., the STI, the first thermal oxide film is removed in a state that the element separation structure forming region (field region) is covered with the resist mask. Since a divot tends to occur in the element separation structure forming region, it is possible to obtain good uniformity within a plane while preventing the divot from being generated. Accordingly, it is possible to prevent electrical property of the element separated with the STI from deteriorating.

DETAILED DESCRIPTION OF PREFERRED EMBODIMENTS

Figure 1:
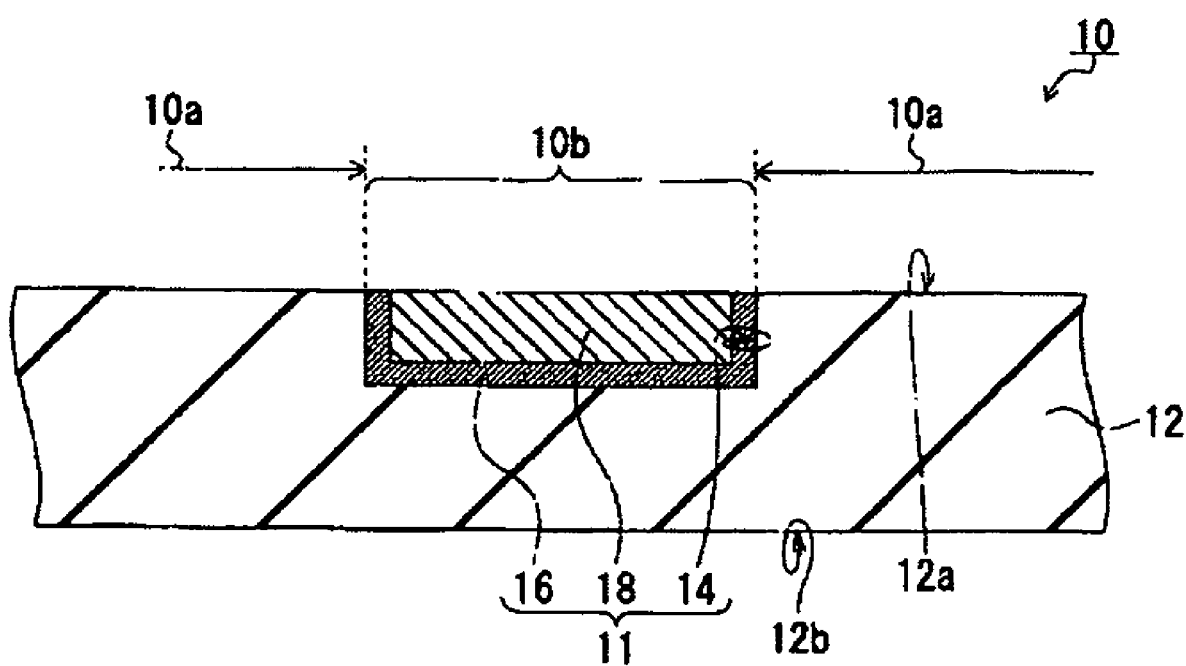
FIG. 1 is a schematic sectional view showing a semiconductor device having an element separation structure according to an embodiment of the present invention.

Hereunder, embodiments of the present invention will be explained with reference to the accompanying drawings. The drawings schematically show shapes, sizes, and a positional relationship of constituents, and the invention is not limited to those shown in the drawings. In the drawings, a size, a shape, and an arrangement of constituting components are schematically shown for explanation of the present invention. Specific materials, conditions, and numerical conditions described in the following description are just an example. In the following description, same reference numerals denote similar components, and explanations thereof are omitted.

A configuration of an element separation structure will be explained with reference to FIG. 1. FIG. 1 is a schematic sectional view showing a semiconductor device having an element separation structure according to an embodiment of the present invention. The semiconductor device such as a semiconductor memory has a large number of elements such as transistors disposed on a substrate such as a silicon substrate.

As shown in FIG. 1, a substrate 12 includes a plurality of element forming regions (first regions) 10a and an element separation structure forming region (second region) 10b for electrically separating the element forming regions 10a. Elements are disposed in the first regions 10a with a conventionally known method. An element separation structure 11 is disposed in the first region 10b for separating the elements. The element separation structure 11 is formed in the substrate 12, and the substrate 12 has a surface 12a and a lower surface 12b opposite to the surface 12a.

The element separation structure 11 includes a groove portion (trench) 14. The groove portion 14 has a depth from the surface 12a of the substrate 12 to a mid point of a thickness of the substrate 12, that is, inside the substrate 12. The groove portion 14 may have a depth, a width, a sectional shape, and an extending pattern in a plan view according to a function of the semiconductor device 10 and a desired electrical property of the elements.

A groove portion oxide film 16 is formed in the groove portion 14 for covering all of exposed surfaces of the groove portion 14, i.e., side surfaces and a bottom surface of the groove portion 14. The groove portion oxide film 16 is not disposed on an exposed surface of a silicon nitride film 30 and an exposed surface of a first thermal oxide film 20 (described later). The groove portion oxide film 16 has a thickness determined arbitrarily, and preferably, for example, between 1.0 and 3.0 nm.

A filling portion 18 is disposed in the groove portion 14 covered with the groove portion oxide film 16. The filling portion 18 may be formed of an insulating filling material such as silicon oxide, and has a flat exposed surface. A plurality of the elements disposed in the first regions 10a is elementally separated with the element separation structure 11 having the structure described above.

Figure 2A:
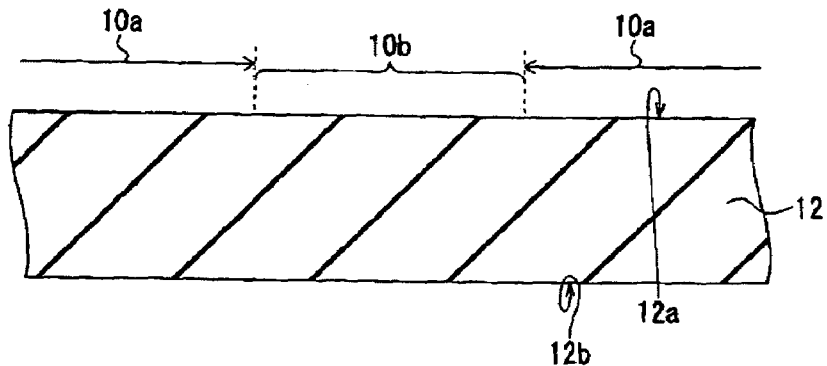
FIGS. 2(A) to 2(C) are schematic sectional views of the semiconductor device having the element separation structure during a process of production.
Figure 2B:
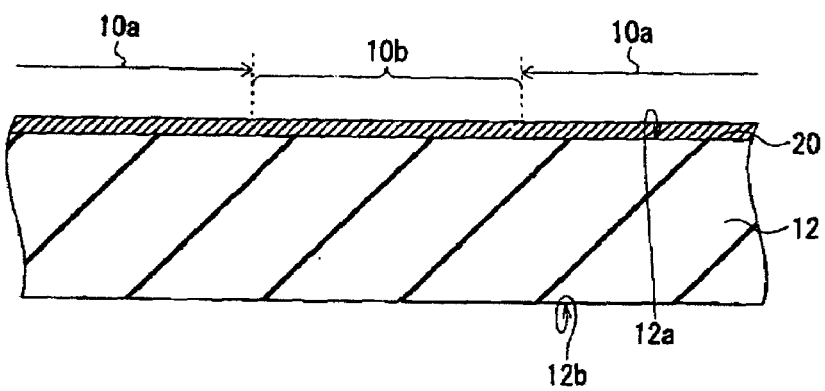
Figure 2C:
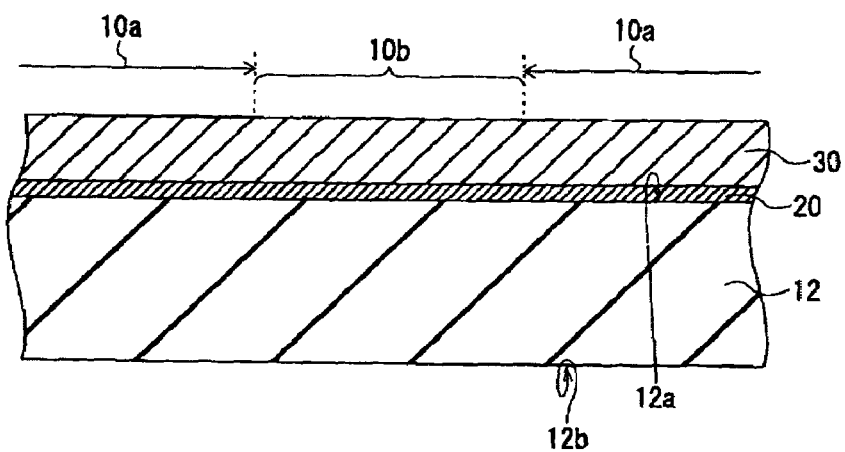
Figure 3A:
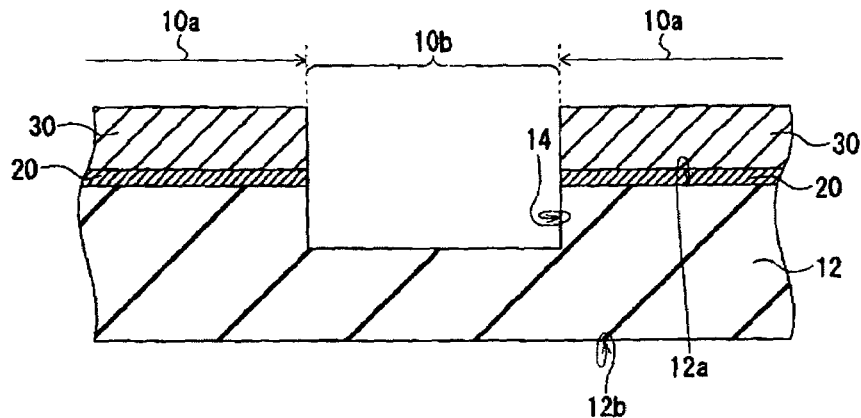
FIGS. 3(A) to 3(C) are schematic sectional views of the semiconductor device having the element separation structure during the process of production continued from FIGS. 2(A) to 2(C)
Figure 3B:
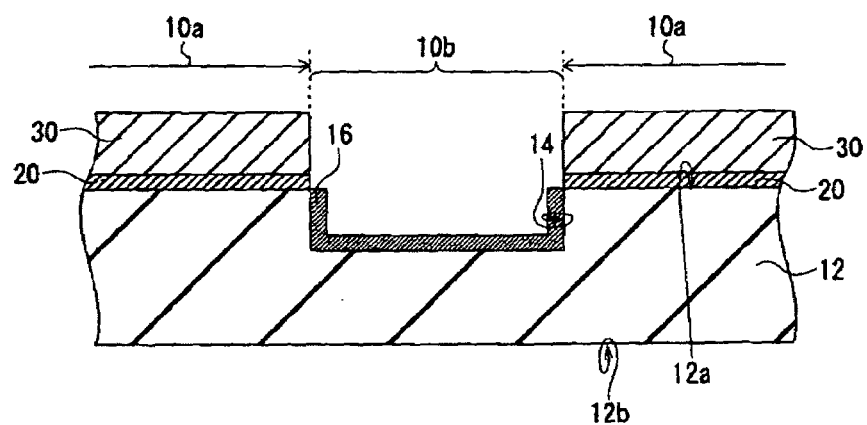
Figure 3C:
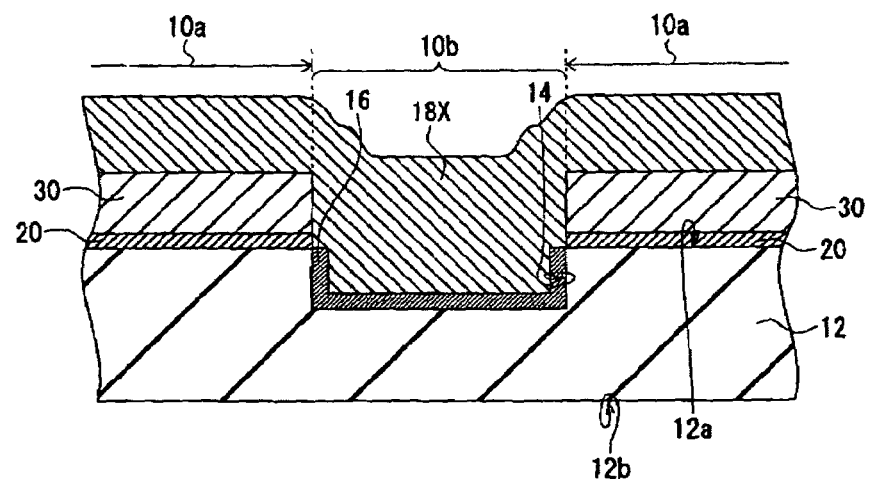
Figure 4A:
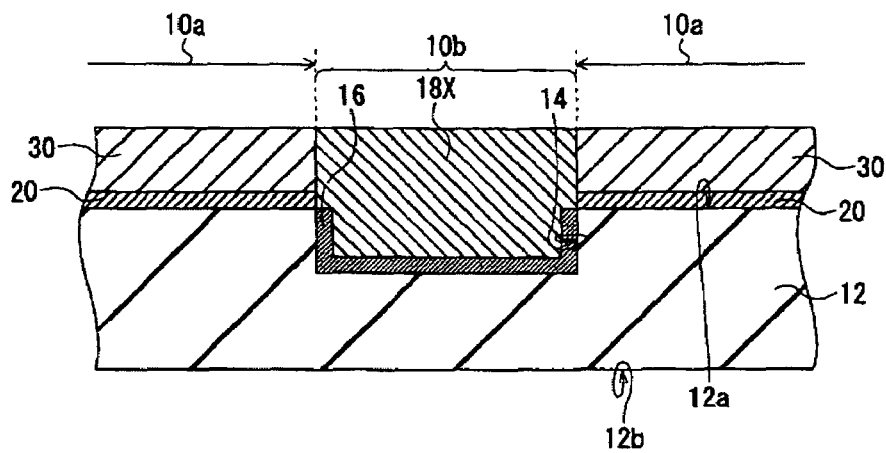
FIGS. 4(A) to 4(C) are schematic sectional views of the semiconductor device having the element separation structure during the process of production continued from FIGS. 3(A) to 3(C)
Figure 4B:
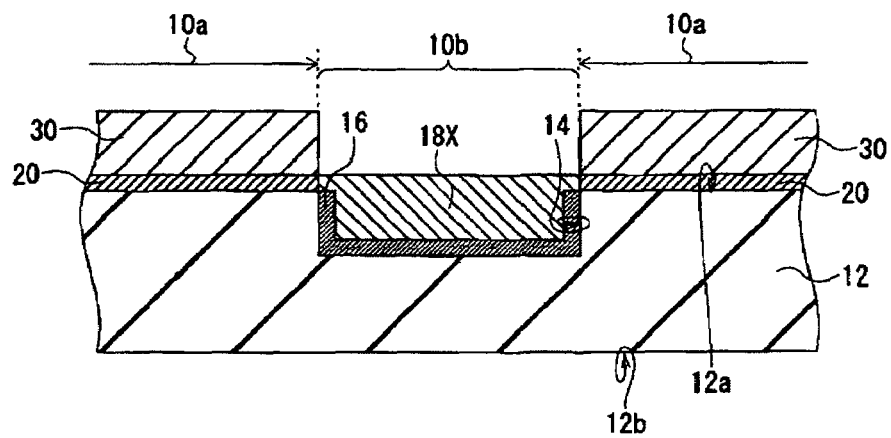
Figure 4C:
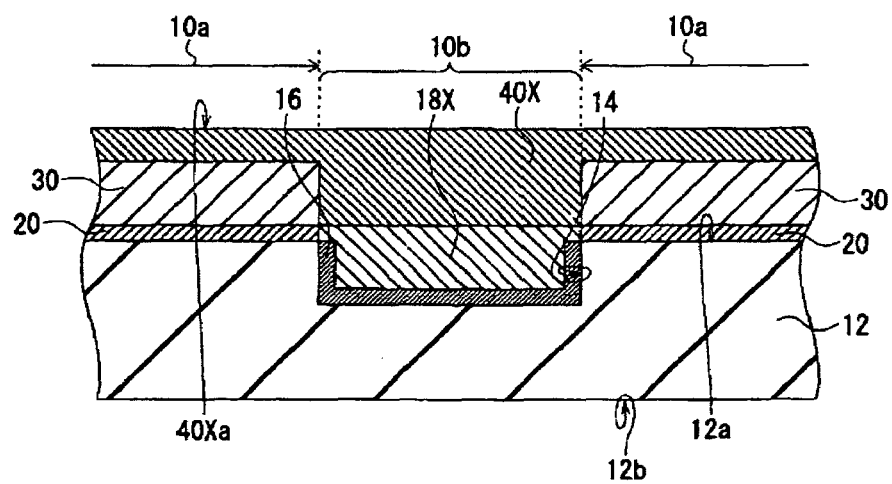
Figure 5A:
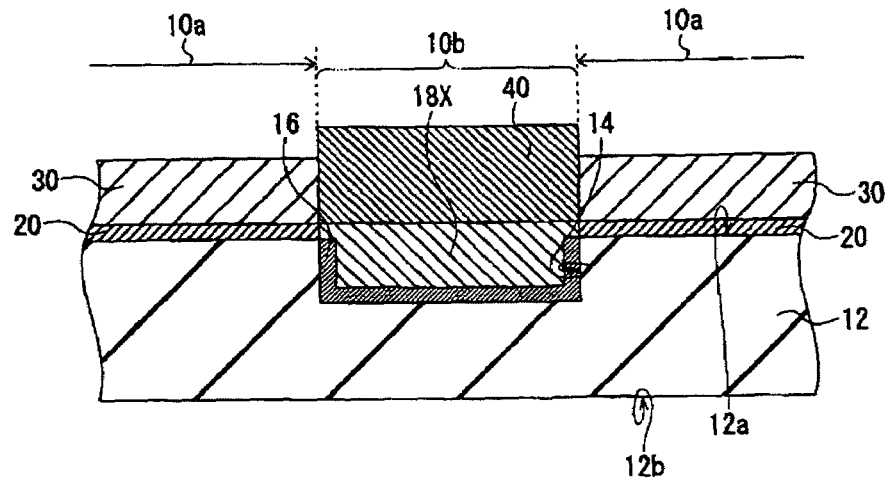
FIGS. 5(A) to 5(C) are schematic sectional views of the semiconductor device having the element separation structure during the process of production continued from FIGS. 4(A) to 4(C)
Figure 5B:
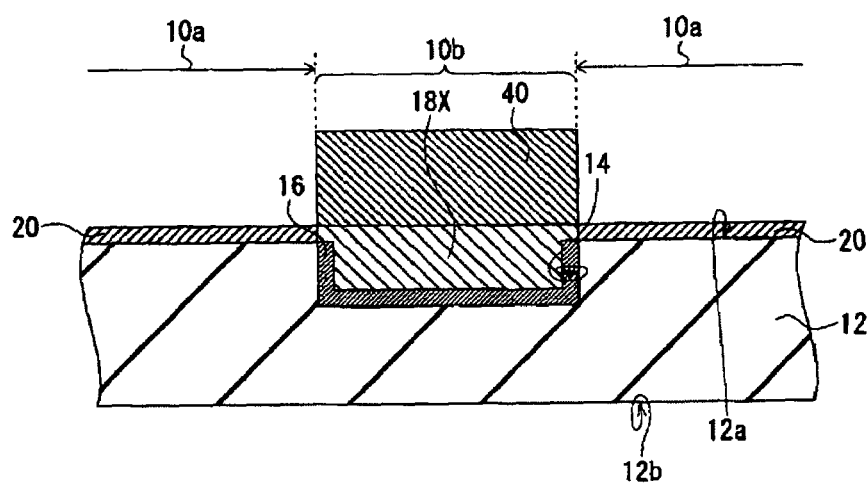
Figure 5C:
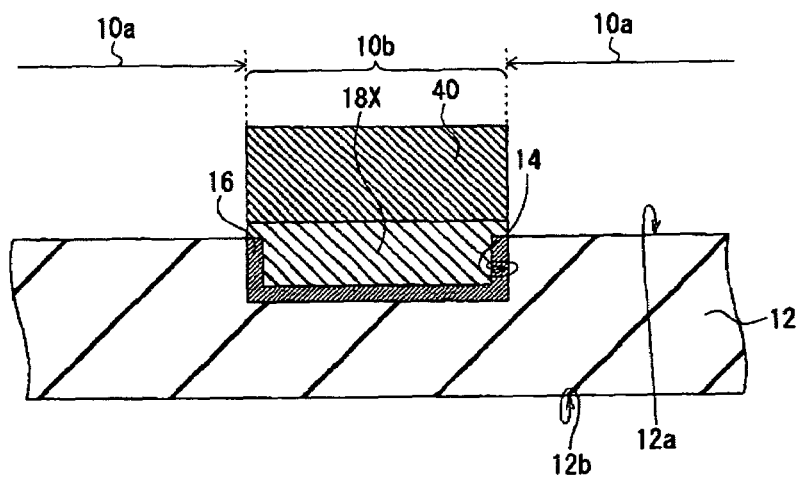
Figure 6A:
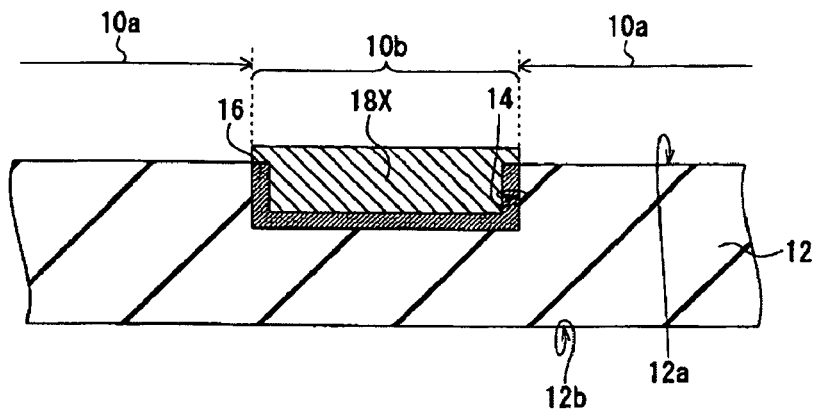
FIGS. 6(A) to 6(C) are schematic sectional views of the semiconductor device having the element separation structure during a process of production continued from FIGS. 5(A) to 5(C).
Figure 6B:
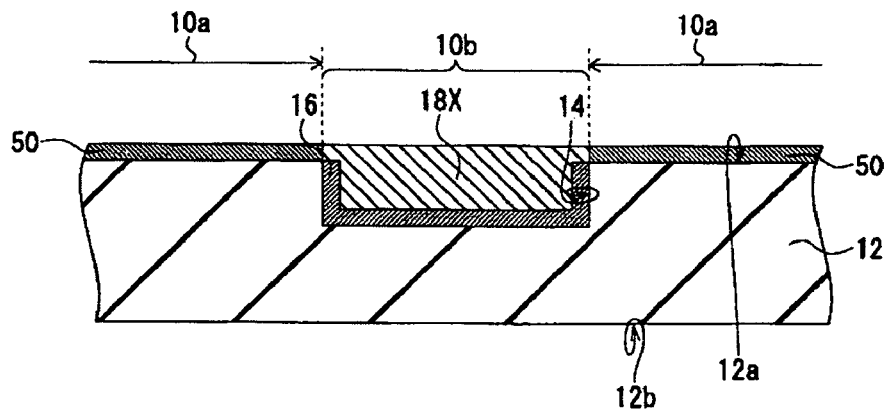
Figure 6C:
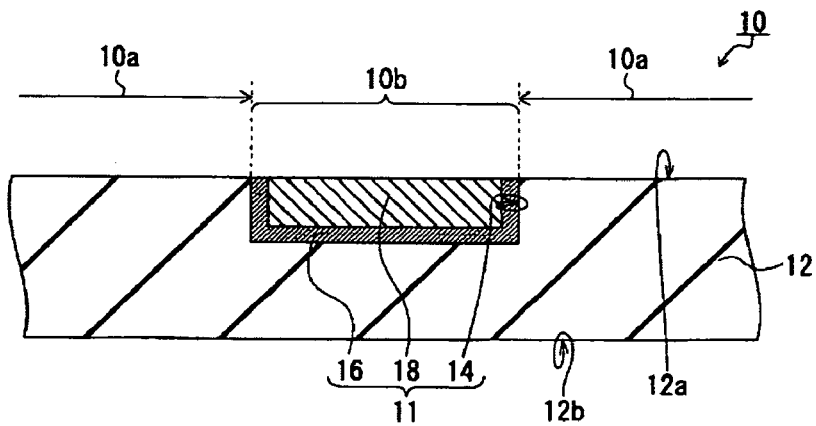

A process of producing the element separation structure of the present invention will be explained next with reference to FIGS. 2(A)-2(C) to 6(A)-6(C). FIGS. 2(A) to 2(C) are schematic sectional views of the semiconductor device having the element separation structure during the process of the production. FIGS. 3(A) to 3(C) are schematic sectional views of the process continued from FIGS. 2(A) to 2(C). FIGS. 4(A) to 4(C) are schematic sectional views of the process continued from FIGS. 3(A) to 3(C). FIGS. 5(A) to 5(C) are schematic sectional views of the process of continued from FIGS. 4(A) to 4(C). FIGS. 6(A) to 6(C) are schematic sectional views of the process continued from FIGS. 5(A) to 5(C).

In the process, first, the substrate 12 is prepared. According to a design of the semiconductor device 10, a plurality of the element forming regions or the first regions 10a and the element separation structure forming region or the second region 10b are defined on the substrate 12 as shown in FIG. 2(A). Next, as shown in FIG. 2(B), a first thermal oxide film 20 is formed on the surface 12a of the substrate 12 with a known method called a thermal oxidation process. The thermal oxidation process is generally performed at 850° C. through a wet oxidation process. Then, as shown in FIG. 2(C), a silicon film 30 is formed on the first thermal oxide film 20 with, for example, a vacuum CVD method. The silicon film 30 preferably has a thickness of, for example, 150 nm.

In the next step, as shown in FIG. 3(A), the first thermal oxide film 20 and the silicon nitride film 30 in the second region 10b are removed. The removal process is performed with a known method such as a photolithography process and a wet etching process. After the removal process, the surface 12a is exposed in the second region 10b, and the surface 12a is further etched to form the groove portion 14 from the surface 12a of the substrate 12 toward inside the substrate 12. Next, as shown in FIG. 3(B), the groove portion oxide film 16 is formed as a thermal oxide film covering inside the groove portion 14 with a known thermal oxidation process under a condition suitable for a specific semiconductor device. Then, as shown in FIG. 3(C), the groove portion 14 covered with the groove portion oxide film 16 is filled to form a pre-filling oxide film 18X, so that the pre-filling oxide film 18X covers exposed surfaces of the silicon nitride film 30 and the first thermal oxide film 20. The pre-filling oxide film 18X is formed as a silicon oxide film with a known method such as a high-density plasma CVD method. The pre-filling oxide film 18X preferably has a thickness of 550 nm to 700 nm.

In the next step, as shown in FIG. 4(A), the pre-filling oxide film 18X is removed such that the silicon nitride film 30 in the first regions 10a is exposed and the pre-filling oxide film 18X in the second region 10b has a height same as that of the silicon nitride film 30. This step is preferably performed with a known method such as a chemical mechanical polishing (CMP) method with the silicon nitride film 30 used as a stopper film. After this step, the pre-filling oxide film 18X has a height at the exposed surface of the silicon nitride film 30.

In the next step, as shown in FIG. 4(B), the pre-filling oxide film 18X is further removed with a known method such as a hydrofluoric acid (HF) process, so that the pre-filling oxide film 18X has a height same as that of the first thermal oxide film 20. In the hydrofluoric acid process, a concentration of hydrofluoric acid is preferably about 5 wt. %. A process time is determined such that the pre-filling oxide film 18X has a height same as that of the first thermal oxide film 20 with reference to thicknesses of the silicon nitride film 30 and the first thermal oxide film 20. Then, as shown in FIG. 4(C), a resist layer 40X is formed using an arbitrary appropriate resist material with a known method, so that the resist layer 40X covers exposed surfaces of the silicon nitride film 30 and the pre-filling oxide film 18X.

In the next step, as shown in FIG. 5(A), the resist layer 40X is patterned to form a resist mask 40. The resist mask 40 has an opening in the first regions 10a (not covering the first region 10a) and covers the first region 10b. The resist layer 40X is preferably patterned with the following three patterning processes.

In the first process, the resist layer 40X is patterned with the photolithography. More specifically, the resist layer 40X in the first regions 10a is removed with a known appropriate process such as an exposure process. In this case, the resist layer 40X has a height higher than that of the silicon nitride film 30.

In the second process, the resist layer 40X is patterned from an upper surface 40Xa thereof over the whole area thereof with the CMP method. The CMP process is performed with the silicon nitride film 30 as a stopper film. Accordingly, the resist layer 40X formed in the first region 10b has a height same as that of the silicon nitride film 30 (not shown).

In the third process, the resist layer 40X is patterned with an etching process. More specifically, the supper surface 40Xa of the resist layer 40X is wet-etched over the whole area thereof using an etchant according to the used resist material under a condition for obtaining an appropriate etching rate. In this case, the supper surface 40Xa of the resist layer 40X has a shape recessed relative to the silicon nitride film 30 (not shown).

In the three patterning processes described above, the resist layer 40X, especially the supper surface 40Xa thereof, have different shapes. As far as the resist layer 40X covers the first region 10b, a difference in the shape of the upper surface is not an issue.

In the next step, as shown in FIG. 5(B), the silicon nitride film 30 exposed from the resist mask 40 is removed with a known method such as a dry etching process. The dry etching is preferably performed using a gas of $CHF_3/Ar/O_2$ under a pressure of 60 mTorr (8 Pa) with a bias power of 400 W. In this process, the silicon nitride film 30 is removed with the dry etching process, so that the resist mask 40 is difficult to peel off from the first region 10b. Then, as shown in FIG. 5(C), the first thermal oxide film 20 exposed from the resist mask 40 is removed with a known method such as the hydrofluoric acid process described above.

In the next step, as shown in FIG. 6(A), the resist mask 40 is removed with a known method under a proper condition according to a material of the resist mask 40. Next, as shown in FIG. 6(B), a second thermal oxide film 50 is formed on an exposed surface of the substrate 12 with the first thermal oxide film 20 removed, i.e., the first regions 10a, for cleaning the substrate surface with a known thermal oxidation method. Then, as shown in FIG. 6(C), the second thermal oxide film 50 is removed with a known method such as the hydrofluoric acid process described above. More specifically, after the hydrofluoric acid process under an arbitrary appropriate condition, the substrate is washed with water and processed in hydrochloric acid hydrogen peroxide solution (HPM) at 70° C. followed by a spin-drying process.

With the thermal oxidation process of forming the second thermal oxide film 50, the pre-filling oxide film 18X is etched with hydrofluoric acid at a rate same as that of the second thermal oxide film 50. Accordingly, when the second thermal oxide film 50 is removed to expose the surface of the substrate, the pre-filling oxide film 18X has a height same as that of the exposed surface, thereby completing a filling portion 18. As shown in FIG. 6(C), after a series of steps described above, the element separation structure 11 is completed. Afterward, a desired semiconductor device is formed with a known wafer process.

In the method of producing the element separation structure, i.e., the STI, the first thermal oxide film is removed in a state that the field region (element separation structure forming region) is covered with the resist mask. That is, in the removal process, the element separation structure forming region is protected with the resist mask. Since a divot tends to occur in the element separation structure forming region, it is possible to obtain good uniformity within a plane while preventing the divot from being generated. Accordingly, it is possible to prevent electrical property of the element separated with the STI from deteriorating.

The disclosure of Japanese Patent Application No. 2004-293587, filed on Oct. 6, 2004, is incorporated in the application.

While the invention has been explained with reference to the specific embodiments of the invention, the explanation is illustrative and the invention is limited only by the appended claims.

What is claimed is:
1. A method of producing an element separation structure, comprising the steps of:
defining a plurality of element forming regions and an element separation structure forming region for separating the element forming regions on a substrate having a surface and a lower surface opposite to the surface;
forming a first thermal oxide film on the surface of the substrate;
forming a silicon nitride film on the first thermal oxide film;
removing the first thermal oxide film and the silicon nitride film in the element separation structure forming region;
forming a groove portion extending from the surface of the substrate into the substrate in the element separation structure forming region;
forming a groove portion oxide film for covering inside the groove portion;
forming a pre-filling oxide film for filling the groove portion covered with the groove portion oxide film and covering exposed surfaces of the silicon nitride film and the first thermal oxide film;
removing the pre-filling oxide film until the silicon nitride film is exposed and the pre-filling oxide film has a first height same as that of the silicon nitride film in the element separation structure forming region;

removing the pre-filling oxide film until the pre-filling oxide film with the first height has a second height same as that of the first thermal oxide film;

forming a resist layer for covering exposed surfaces of the silicon nitride film and the pre-filling oxide film;

patterning the resist layer to form a resist mask having openings at the element forming regions and covering the element separation structure forming region;

removing the silicon nitride film exposed from the resist mask;

removing the first thermal oxide film exposed from the resist mask;

removing the resist mask;

forming a second thermal oxide film on an exposed surface of the substrate with the first thermal oxide film removed; and removing the second thermal oxide film and leveling the pre-filling oxide film at a third height same as that of an exposed surface of the substrate with the second thermal oxide film removed to form a filling portion.

2. The method according to claim 1, wherein said step of patterning the resist layer to form the resist mask includes the steps of forming the resist layer for covering the element forming regions and the element separation structure forming region, and then removing the resist mask in the element separation structure forming region with a photolithography process.

3. The method according to claim 1, wherein said step of patterning the resist layer to form the resist mask includes the steps of forming the resist layer for covering the element forming regions and the element separation structure forming region, and then polishing an entire upper surface of the resist layer with a chemical mechanical polishing process so that the silicon nitride film is exposed.

4. The method according to claim 1, wherein said step of patterning the resist layer to form the resist mask includes the steps of forming the resist layer for covering the element forming regions and the element separation structure forming region, and then removing an entire upper surface of the resist layer with an etching process so that the silicon nitride film is exposed.

* * * * *